United States Patent
Necco (10) Patent No.: US 8,593,771 B2
(45) Date of Patent: Nov. 26, 2013

(54) POWER MODULES WITH REVERSE POLARITY PROTECTION

(75) Inventor: Fabio Necco, San Francisco, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 279 days.

(21) Appl. No.: 13/030,092

(22) Filed: Feb. 17, 2011

(65) Prior Publication Data

US 2012/0212870 A1 Aug. 23, 2012

(51) Int. Cl.
*H02H 3/00* (2006.01)
*H02H 5/04* (2006.01)
*H02H 7/08* (2006.01)

(52) U.S. Cl.
USPC .................................. 361/84; 361/23; 361/86

(58) Field of Classification Search
USPC .................................. 361/23, 86, 84
See application file for complete search history.

(56) References Cited

U.S. PATENT DOCUMENTS

| | | | |
|---|---|---|---|
| 6,661,260 B2* | 12/2003 | Nakahara et al. | 327/109 |
| 8,067,859 B2* | 11/2011 | Koeppl et al. | 307/127 |
| 2010/0148733 A1* | 6/2010 | Koeppl et al. | 323/225 |

OTHER PUBLICATIONS

Fairchild Semiconductor, Internet Web Page entitled "Automotive Power Modules," http://www.farchildsemi.com/markets/automotive/automotive_power_modules.html, downloaded Oct. 22, 2010, 3 pages, Fairchild Semiconductor, Portland Maine.
Fairchild Semiconductor, "Automotive Solutions," Marketing Brochure, Nov. 2010, 48 pages, Fairchild Semiconductor, Portland Maine.

* cited by examiner

*Primary Examiner* — Jared Fureman
*Assistant Examiner* — Lucy Thomas
(74) *Attorney, Agent, or Firm* — Kenneth E. Horton; Kirton McConkie (57) ABSTRACT

Power handling circuits that may be packaged as power modules, and methods of operating semiconductor devices in such circuits and modules. An exemplary circuit comprises power terminals to receive electrical power, a first semiconductor device, a first drive circuitry, and a second drive circuitry. The first drive circuitry provides a drive signal to the first semiconductor device in accordance with a desired circuit function when the electrical power received at the power terminals has the positive polarity, and ceases providing the drive circuit when the electrical power received at the power terminals has the negative polarity. During the negative polarity condition, the second drive circuitry provides a drive signals to the first semiconductor device which causes its primary current conduction path to conduct, thereby reducing the power dissipation in the device's parasitic path, and optionally causing a fuse in the circuit providing power to the circuit to blow.

24 Claims, 5 Drawing Sheets

POWER MODULES WITH REVERSE POLARITY PROTECTION

CROSS-REFERENCES TO RELATED APPLICATIONS

Not Applicable

BACKGROUND OF THE INVENTION

In an effort to make automobiles more fuel-efficient, automobile manufacturers are increasing their integration of intelligent power electronics into automobiles. One such example is electric power steering where the conventional hydraulic pump and power-assist piston are replaced by an electric motor that assists the movement of the car's steering mechanism. The electric motor responds to signals generated by sensors in the steering column that sense the torque being applied to the steering wheel by the driver. The electric motor only applies force when the sensors determine that assistance is needed, thereby conserving energy. In addition, the amount of assisting force can be reduced as the speed of the automobile increases. These features dramatically reduce energy consumption compared to the conventional hydraulic pump and piston system. In a similar manner, conventional water pumps and cooling fans can be replaced with electric motor equivalents that are driven by smart electronics. In addition, the use of higher voltage electrical systems in cars opens the possibility of replacing conventional air-conditioning compressors with more efficient electric motor equivalents.

BRIEF SUMMARY OF THE INVENTION

As part of making his invention, the inventor has recognized that the power modules that drive the electric motors in the aforementioned applications are required to function under a variety of operating conditions, including the relatively rare condition where an automotive technician inadvertently crosses the connections to the automobile's battery or to the motor module. Such cross connection can occur upon installation of a new battery or new motor module. The cross connection results in a reverse power polarity, or negative polarity, being applied to the automobile's electrical system or motor module. The inventor has further recognized that, while the power transistors used in the power modules of such motor modules will be in their non-conducting states when the negative polarity condition occurs, the power transistors have parasitic body diodes that can conduct currents sufficient in magnitude to destroy the transistors through resistive heating effects. Unlike conventional rectifiers, these body diodes have relatively high voltage drops and high parasitic series resistances.

As also part of making his invention, the inventor recognizes that the problem could be solved by inventing a "smart switch" that could be installed between the battery and the automobile's electrical power system that would disconnect under the reverse condition, and by having automobile makers install such a smart switch on all new vehicles. However, this approach has a number of disadvantages. First, such a smart switch would introduce a voltage drop in the system that would reduce efficiency. Second, the smart switch would require complex design to enable charging of the battery by the alternator. Third, it is an expensive solution since it must be designed to handle several hundreds of amperes (much more expensive than a simple relay, which in turn has reliability issues). Fourth, such a system would not work for aftermarket replacement parts for older vehicles that would not have the smart switch. Fifth, the smart switch would not address the problem of reverse connections made to a motor module upon installation. Another possible solution to the problem might be to connect a rectifier or transistor switch between the power module and the positive supply from the battery. However, this solution would have the same above-described disadvantages, except for the complex design to allow alternator charging of the battery. Instead, the inventor takes the unconventional approach of configuring the power module to cause the power transistors (which are semiconductor devices) to enter conducting states when the reverse polarity condition occurs. This lowers the voltage drop across each power transistor to forestall destruction by resistive heating, and increases the current flow to cause the automobile's fuse to the power module to blow. The induced blowing of the fuse halts the current flow and prevents destruction of the transistors. While the invention causes the destruction of one or more of the automobile's fuses, these fuses are far cheaper and easier to replace than the power modules. The invention enables the power module to survive during the fusing time (the time required by the fuse to become an open circuit) without adding additional power devices, but by using the power devices already in power module and without having to re-size the fuse.

Accordingly, a first general embodiment according to the present invention pertains to a power handling circuit that may be packaged as a power module, the circuit comprising a positive power terminal, a negative power terminal, a first semiconductor device (e.g., a power transistor), a first drive circuitry, and a second drive circuitry. The positive power terminal and the negative power terminal receive an electrical power source. The power received by the power terminals can have a positive polarity when the positive power terminal has a higher electrical potential than the negative power terminal, and can have a negative polarity when the negative power terminal has a higher electrical potential than the positive power terminal. The first semiconductor device has a first conduction terminal, a second conduction terminal, a modulation terminal, and a primary current path between its first and second conduction terminals. The first semiconductor device conducts current through its primary current path responsive to an electrical signal applied to its modulation terminal. The first drive circuitry is coupled to the modulation terminal of the first semiconductor device, and generates an electrical signal that is coupled to the modulation terminal when the electrical power received at the power terminals has the positive polarity. The second drive circuitry is coupled to the modulation terminal of the first semiconductor device, and couples an electrical signal to the modulation terminal of the first semiconductor device that causes the primary current path of the first semiconductor device to become conductive when the electrical power received at the power terminals has the negative polarity.

The power handling circuit according to the first general embodiment may further comprise a first circuit path from the positive power terminal to the negative power terminal through which current may flow. The first circuit path may include the first semiconductor device, and the first and second conduction terminals of the first semiconductor device may be coupled to the first circuit path. The first semiconductor device may further comprise a parasitic current path between its first and second conduction terminals. The parasitic current path may conduct current when the electrical power received at the power terminals has the negative polarity.

The power handling circuit according to the first general embodiment may further comprise a first control input that receives a first control signal. Also, the first drive circuitry may have an input coupled to the first control input, and may generate its electrical signal to the modulation terminal of the first semiconductor device in a manner that is responsive to the electrical signal present on the first control input.

A second general embodiment according to the present invention pertains to a method of operating a semiconductor device in a power handling circuit, the power handling circuit having a positive power terminal and a negative power terminal to receive an electrical power source, an input terminal to receive an input signal, and a first semiconductor device having a first conduction terminal, a second conduction terminal, a modulation terminal, and a primary current path between its first and second conduction terminals. The electrical power received at the power terminals has a positive polarity when the positive power terminal has a higher electrical potential than the negative power terminal, and has a negative polarity when the negative power terminal has a higher electrical potential than the positive power terminal. The exemplary method comprises providing, when the electrical power received at the power terminals has the positive polarity, a control signal to the modulation terminal of a first semiconductor device that is responsive to the received input signal; and providing, when the electrical power received at the power terminals has the negative polarity, a signal to the modulation terminal of a first semiconductor device that causes a current to flow through the primary current path of the first semiconductor device.

The above exemplary embodiments and other embodiments of the inventions are described in the Detailed Description with reference to the Figures. In the Figures, like numerals may reference like elements and descriptions of some elements may not be repeated.

BRIEF DESCRIPTION OF THE DRAWINGS

In the figures, two electrical signal lines that cross one another are not electrically coupled to one another unless this is a connection dot present at their intersection.

DETAILED DESCRIPTION OF THE INVENTION

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. The same reference numerals are used to denote the same elements throughout the specification. The elements may have different interrelationships and different positions for different embodiments.

It will also be understood that when an element, such as a semiconductor device, transistor, a resistor, or a terminal, is referred to as being "connected to," "electrically connected to," "coupled to," or "electrically coupled to" another element, it may be directly connected or coupled to the other element, or one or more intervening elements may be present in the coupling. In contrast, when an element is referred to as being "directly connected to" or "directly coupled to" another element, there are no intervening elements present. The term "and/or" used herein includes any and all combinations of one or more of the associated listed items. Where a figure of the application shows one element connected to another, the figure supports all of the above possible embodiments unless stated otherwise by the present specification.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise," "include," "have," "comprising," "including,", and/or "having" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package, module) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, elements, regions, and/or portions. However, it is obvious that the members, components, elements, regions, and/or portions should not be defined by these terms. The terms are used only for distinguishing one member, component, element, region, layer, or portion from another member, component, region, layer, or portion. Thus, a first member, component, element, region, or portion which will be described may also refer to a second member, component, element, region, or portion, without departing from the scope of the present invention.

Figure 1:
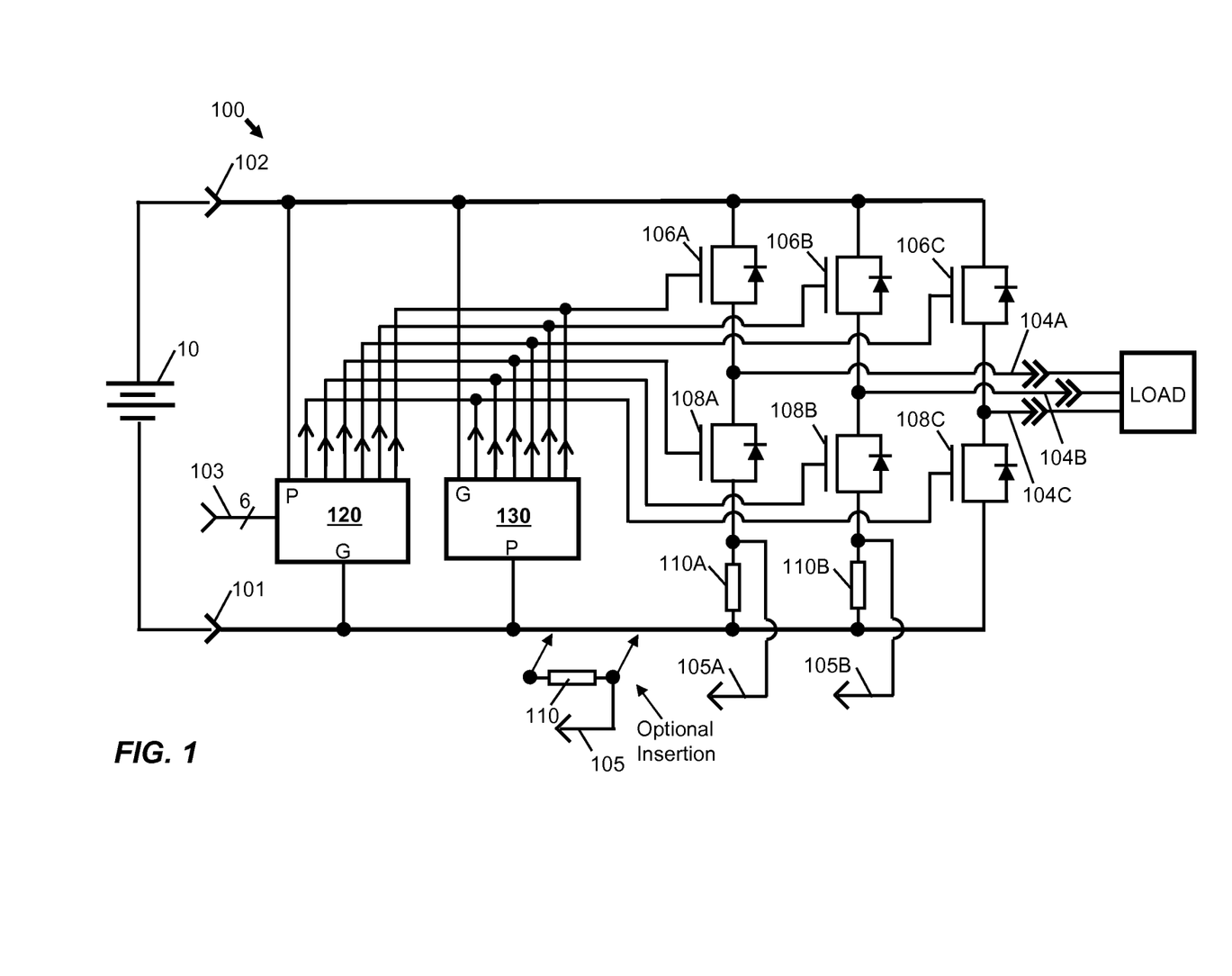
FIG. 1 shows an exemplary power handing circuit embodiment and power module embodiment according to the present invention.

FIG. 1 shows a first exemplary power module 100 using an embodiment of an exemplary power handling circuit according to the present invention. Power module 100 may be used to provide electric drive signals to a 3-phase AC motor. Power module 100 comprises a positive power terminal 102 and a negative power terminal 101 that receive a direct-current (DC) electrical power source 10 that is presented to power module 100. Electrical power source 10 presents a positive polarity to power module 100 when it causes positive power terminal 102 to have a higher electrical potential than negative power terminal 101, and presents negative polarity when it causes negative power terminal 101 to have a higher electrical potential than positive power terminal 102. Power module 100 further comprises a plurality of output power terminals 104A-104C that provide power to an output load (e.g., a 3-phase AC motor), a bank of high-side power transistors 106A-106C, and a bank of low-side power transistors 108A-108C. Each power transistor 106A-C, 108A-C comprises a first conduction terminal (e.g., drain, collector), a second conduction terminal (e.g., source, emitter), a modulation terminal (e.g., gate, base), a primary current path between its first and second conduction terminals, and a parasitic current path (e.g., body diode) between its first and second conduction terminals. Each power transistor conducts current through its primary current path responsive to an electrical signal applied to its modulation terminal. Each is also an example of a semiconductor device, and more particularly a semiconductor switching device. Also, given the interconnections that are described below, each power transistor conducts a current through its parasitic current path when the electrical power source received at power terminals 101-102 has the above-described negative polarity. Each power transistor may take the form of a metal-oxide field effect transistor (MOSFET), a bipolar-junction transistor (BJT), an insulated-gate bipolar transistor (IGBT), another type of transistor, or any combination thereof. Each transistor may be in the planar configuration where all of its terminals appear on the active surface of the semiconductor substrate upon which the transistor is built, and where the primary current path has a primary leg that is parallel to the active surface of the semiconductor substrate. Each transistor may also have the vertical configuration where the modulation terminal and one conduction terminal is disposed at the active surface of the semiconductor substrate and the other conduction terminal is disposed at the back surface of the semiconductor substrate, and where the primary current path has a primary leg that is perpendicular to the active surface of the semiconductor substrate.

High-side power transistor 106A has its first conduction terminal electrically coupled to positive power terminal 102 and its second conduction terminal electrically coupled output node 104A, and low-side power transistor 108A has its first conduction terminal electrically coupled to output node 104A and its second conduction terminal electrically coupled negative power terminal 101. Transistors 106A and 108A are oriented so that the parasitic conduction path provided by their body diodes are conducting when power source 10 has the above-described negative polarity, and are non-conducting when power source 10 has the above-described positive polarity. An optional resistor 110A may be electrically coupled in series between the second conduction terminal of low-side power transistor 108A and negative power terminal 101 to generate a sensor signal 105A that may be used for control purposes. The modulation terminals of power transistors 106A and 108A are electrically coupled to a first drive circuitry 120. Power switches 106A and 108A may be switched on and off in an alternating non-overlapping manner by an external control circuitry (not shown) through a first drive circuitry 120 to provide a first phase of a 3-phase AC drive to a motor. As described below in greater detail, first drive circuitry 120 receives a plurality of control signals from this external control circuitry at a bank of control terminals 103 and generates the appropriate drive signals to the modulation terminals.

With the above configuration, it may be appreciated that power transistors 106A and 108A and resistor 110A provide a first circuit path from the positive power terminal 102 to the negative power terminal 101, with the first circuit path including power transistors 106A and 108A. It may also be appreciated that each power transistor 106A, 108A has its conduction terminals coupled to the first circuit path, a modulation terminal that receives a control signal from first driver circuitry 120, a primary current path between its first and second conduction terminals, and a parasitic current path between its first and second conduction terminals. Also, each of said power transistors conducts current through its primary current path responsive to an electrical signal applied to its modulation terminal when electrical power source 10 received at the power terminals 101, 102 has the positive polarity, and conducts current through its parasitic current path when electrical power source 10 received at the power terminals 101, 102 has the negative polarity.

In a similar manner, high-side power transistor 106B has its first conduction terminal electrically coupled to positive power terminal 102 and its second conduction terminal electrically coupled output node 104B, and low-side power transistor 108B has its first conduction terminal electrically coupled to output node 104B and its second conduction terminal electrically coupled negative power terminal 101. Transistors 106B and 108B are oriented so that the parasitic conduction path provided by their body diodes are conducting when power source 10 has the above-described negative polarity, and are non-conducting when power source 10 has the above-described positive polarity. An optional shunt resistor 110B may be electrically coupled in series between the second conduction terminal of low-side power transistor 108B and negative power terminal 101 to generate a sensor signal 105B that may be used for control purposes. The modulation terminals of power transistors 106B and 108B are electrically coupled to a first drive circuitry 120. Power switches 106B and 108B may be switched on and off in an alternating non-overlapping manner by an external control circuitry (not shown) through a first drive circuitry 120 to provide a second phase of a 3-phase AC drive to a motor. Also in a similar manner, high-side power transistor 106C has its first conduction terminal electrically coupled to positive power terminal 102 and its second conduction terminal electrically coupled output node 104C, and low-side power transistor 108C has its first conduction terminal electrically coupled to output node 104C and its second conduction terminal electrically coupled negative power terminal 101. (No optional shunt resistor is used for this circuit path, but one can be included if desired.) Transistors 106C and 108C are oriented so that the parasitic conduction path provided by their body diodes are conducting when power source 10 has the above-described negative polarity, and are non-conducting when power source 10 has the above-described positive polarity. The modulation terminals of power transistors 106C and 108C are electrically coupled to a first drive circuitry 120. Power switches 106C and 108C may be switched on and off in an alternating non-overlapping manner by an external control circuitry (not shown) through a first drive circuitry 120 to provide a third phase of a 3-phase AC drive to a motor.

With the above configuration, it may be appreciated that power transistors 106B and 108B and resistor 110BA provide a second circuit path from the positive power terminal 102 to the negative power terminal 101, with the second circuit path including power transistors 106B and 108B. Each power transistor 106B, 108B has its conduction terminals coupled to the second circuit path, a modulation terminal that receives a control signal from first driver circuitry 120, a primary current path between its first and second conduction terminals, and a parasitic current path between its first and second conduction terminals. Similarly, transistors 106C and 108C provide a third circuit path from the positive power terminal 102 to the negative power terminal 101, with the third circuit path including power transistors 106C and 108C. Each power transistor 106C, 108C has its conduction terminals coupled to the third circuit path, a modulation terminal that receives a control signal from first driver circuitry 120, a primary current path between its first and second conduction terminals, and a parasitic current path between its first and second conduction terminals. Also, each of said power transistors conducts current through its primary current path responsive to an electrical signal applied to its modulation terminal when electrical power source 10 received at the power terminals 101, 102 has the positive polarity, and conducts current through its parasitic current path when electrical power source 10 received at the power terminals 101, 102 has the negative polarity.

In some implementations, optional shunt resistors 110A and 110B may be replaced by optional shunt resistor 110 that is coupled between negative power terminal 101 and a common source connection to the source terminals of all three transistors 108A-C, as indicated by the optional markings in FIG. 1. A sensor signal 105 may be generated at the common source connection.

Power module 100 further comprises a second drive circuitry 130 having a plurality of outputs coupled to the modulation terminals of power transistor 106A-C, 108A-C. Second drive circuitry circuit 130 preferably generates and couples an electrical signal to the modulation terminal of each power transistor that causes the primary current path of the power transistor to conduct current when the electrical power source received at the power terminals 101, 102 has the above-described negative polarity. At the start of the negative polarity condition, the parasitic current paths (e.g., body diodes) of power transistors 106A-C and 108A-C conduct, and effectively clamp the voltage across power terminals 101, 102 to a magnitude of approximately 2V, with negative power terminal 101 having a higher potential (more positive) than positive power terminal 102. Second drive circuitry 130 responds to the negative polarity condition, and generates and couples control signals to power transistors 106A-C and 108A-C to cause their primary current paths to conduct, thereby lowering the voltage drop across the transistors' parasitic current paths, thereby reducing heat generation and preventing destructive damage to the power transistors of power module 100. The activation of the primary current paths under the reverse polarity condition also increases the current conducted through power module 100, which usually causes a fuse in an automotive application to blow and stop the entire flow of current, also thereby reducing heat generation and preventing destructive damage to the power transistors of power module 100. In typical implementations, the activation of the power transistors 106A-C and 108A-C in this manner can reduce the heat generation in module 100 by a factor of 6 to 8, depending on the conditions. In some implementations, one may only need to activate one pair of power transistors, such as transistors 106C and 108C, in order to reduce the heat generation to a safe level and/or to cause a power fuse to blow, as described above. First and second drive circuitries 120 and 130 are described below in greater detail.

First drive circuitry 120 comprises a plurality of inputs that receive a plurality of control signals coupled to control terminals 103 by an external circuit (not shown, and not part of the invention), and a plurality of outputs that are coupled to the modulation terminals of power transistors 106A-C and 108A-C as described above and shown in FIG. 1. First drive circuitry 120 comprises a power port coupled to positive power terminal 102 and a ground port coupled to negative power terminal 101, as shown in FIG. 1. First drive circuitry 120 is powered by the voltage and power provided between its power and ground ports. When electrical power source 10 received at the power terminals 101-102 has the positive polarity, first drive circuitry 120 generates the appropriate electrical drive signals to the modulation terminals of the power transistors, the drive signals being generated in response to the electrical signals present at control terminals 103. First drive circuitry 120 may translate the voltage levels of the signals at terminals 103 to voltage and power levels appropriate for the transistors. It may also modify the signals to ensure that the drive signals to each pair of transistors 106X and 108X, where X can be A, B, or C, are non-overlapping. In can also generate the signals for each pair of transistors 106X and 108X from one common input control signal provided at a control terminal 103. Numerous exemplary embodiments for first drive circuitry 120 are well known to the art, and may be selected based on the particular needs of a power module by one of ordinary skill in the art without undue experimentation. When electrical power source 10 received at the power terminals 101-102 has the negative polarity, first drive circuitry 120 preferably ceases generating control signals to the modulation terminals of power transistors 106A-C and 108A-C so that second drive circuitry 130 can provide appropriate control signals under the negative polarity condition without interference. However, it is acceptable for first drive circuitry 120 to generate a control signal to a power transistor during the negative polarity condition if that control signal adds to, or is overridden by, the control signal generated by second drive circuitry 130.

Some commercially-available embodiments of first drive circuitry 120 are constructed so that when power source 10 has the negative polarity, they inherently are not damaged and inherently do not generate control signals to the modulation terminals of transistors 106A-C and 108A-C. Such circuitry may be implemented in a double-nested well CMOS technology known in the art, where the potentials of nested wells are controlled to account for the possibility of the reverse bias condition. In these cases, these embodiments of first drive circuitry 120 may be included in power module 100 without modification to the connections shown in the figure. However, the double-nested well technology is more expensive, and drive dice are often implemented in less-expensive single-well technology, which does not have the reverse polarity protection. One of ordinary skill in the art can determine if an embodiment of first drive circuitry 120 has these inherent reverse-polarity protection properties from the manufacturer's literature, or from empirical testing. In empirical testing, one applies a power source of reverse polarity to the power and ground ports of the embodiment, preferably through a current-limiting resistor (such as one that would limit the current to twice the normal current draw by the embodiment, as indicated by the manufacturer's datasheet), measuring the current drawn from the power source by the embodiment while the control inputs are switched through their possible combinations (e.g., switched between the power and ground potentials of the power source). If the embodiment of circuitry 120 draws a current in excess of its normal current during any states of the control signals, then it likely does not have the above inherent properties, and one of the connection modifications described below may be used so that embodiment may be incorporated in power module 120. If the embodiment draws little or no current, then its outputs should be tested to determine if the embodiment would be trying to apply any control signals to the modulation terminals of the power transistors under the negative polarity condition. For this, one of ordinary skill in the art can connect one end of a test resistor to each output, can connect the other end of each test resistor to the power side of the reversed power source and measure current through the resistor while cycling the control signals through their possible states, and can then connect the other end of each test resistor to the ground side of the power source and measure current through the resistor while cycling the control signals through their possible states. If a current flows through this test resistor under any of the testing conditions, then the embodiment of circuitry 120 likely does not have the above inherent properties, and one of the connection modifications described below may be used so that embodiment may be incorporated in power module 120.

Figure 2A:
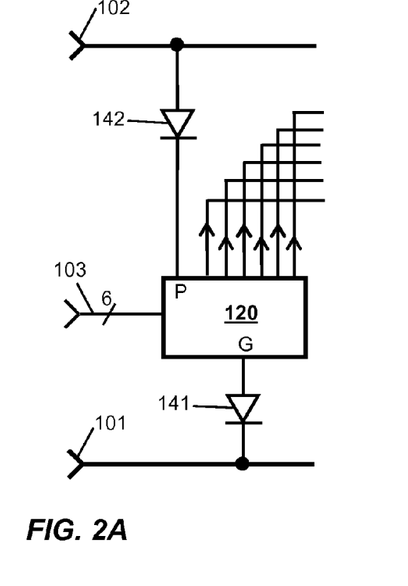
FIGS. 2A and 2B illustrate exemplary connection modifications that may be used when implementing some embodiments of the present invention.

FIG. 2A shows a first connection modification for those embodiments of first drive circuitry 120 that can be damaged when power source 10 has the negative polarity, and/or that can generate interfering control signals to the modulation terminals of transistors 106A-C and 108A-C when power source 10 has the negative polarity. The modification includes coupling a first current rectifier 141 (e.g., diode) in series with the ground feed to first drive circuitry 120, and coupling a second current rectifier 142 (e.g., diode) in series with the power feed to first drive circuitry 120, where the diodes are oriented so that current is only allowed to flow when the electric power source coupled to power terminals 101, 102 has the positive polarity. For example, the anode of first current rectifier 141 is coupled to the ground port of first drive circuitry 120, the cathode of first current rectifier 141 is coupled to negative power terminal 101, the anode of second current rectifier 142 is coupled to positive power terminal 102, and the cathode of second current rectifier 142 is coupled to the power port of first drive circuitry 120. Current rectifier 141 and 142 may comprise Schottky diodes that have relatively low voltage drops (around 0.3 V) under forward bias, which typically have minimal impact on the drive capability of first drive circuitry 120. Current rectifiers 141 and 142 are preferably formed on semiconductor dice that are physically separate from the one or more semiconductor dice that may be used to implement first drive circuitry 120 (e.g., the rectifiers are discrete components). This separation prevents parasitic current paths from being formed between the components that might defeat the intended purpose of rectifiers 141 and 142. Typically, during the negative polarity condition, the circuit nodes in the implementation of first drive circuitry 120 will move toward the voltage being applied by the control signals generated by second drive circuitry 130. This is because the outputs of both drive circuitries 120, 130 are coupled together by their common couplings to the modulation terminals of the power transistors 106, 108, and because the outputs of circuitry 120 are typically coupled to doped regions of the semiconductor substrates (e.g., drain regions of some of the transistors formed).

Depending upon the device technology used in the semiconductor dice of circuitry 120 and depending upon the device technology of the power transistors 106A-C, 108A-C, one of the current rectifiers 141 and 142 may be omitted from the connection modification. For example, when power transistors 106A-C, 108A-C comprise n-channel MOSFETs and circuitry 120 is implemented with simple n-well CMOS technology built on a p-type substrate, then first current rectifier 141 can be omitted. The reason for this is complex, but is summarized as follows. During the negative polarity condition, rectifier 142 decouples the n-wells, which hold the PMOS transistors, from the potential on positive power terminal 102. Consequently, the n-wells and the PMOS transistors therein initially float with the potential of the p-type substrate, even though each is separated from the substrate by a p-n diode structure. The n-type source and drain regions of the NMOS transistors therein also float with the potential of the p-type substrate, which in turn is coupled to negative power terminal 101. This floating action causes the potentials on the circuit nodes and outputs of first drive circuitry 120 to move toward the potential present on negative power terminal 101 (which may be around +2V relative to the potential on positive power terminal 102, as indicated above). At the same time (as described below), second drive circuitry 130 is generating positive potential above +2V on its outputs, which are coupled to both the outputs of first drive circuitry 120 and the modulation terminals of the power transistors 106A-C, 108A-C. The higher positive voltage generated by second drive circuitry 130 can then raise the potential of the n-wells and source and drain regions of the NMOS transistors of the CMOS implementation of circuitry 120 above the level of the potential on negative power terminal 101 since the rising voltage reverse biases the p-n diode structure that is formed between each of these components and the p-type substrate. This rising action essentially decouples the outputs of this CMOS implementation of first drive circuitry 120 from the potential on negative power terminal 101, which prevents circuitry 120 from interfering with the action of second drive circuitry 130. As another example, second current rectifier 142 can be omitted (with first current rectifier 141 retained) when power transistors 106A-C, 108A-C comprise p-channel MOSFETs and circuitry 120 is implemented with the above-described simple n-well CMOS technology built on a p-type substrate.

Figure 2B:
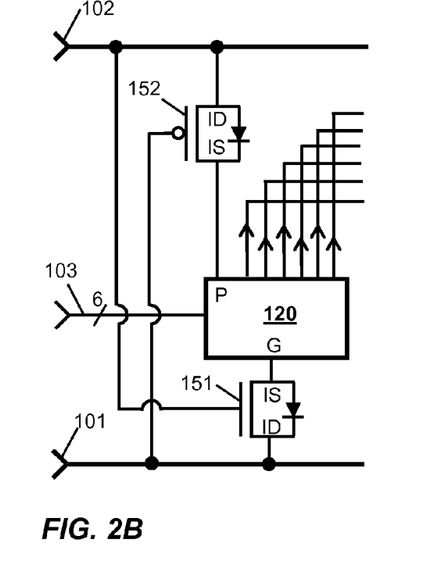

Instead of using first and second rectifying devices 141 and 142, a discrete NMOS transistor 151 and a discrete PMOS transistor 152 may be used, as illustrated in FIG. 2B (these discrete transistors are disposed on individual semiconductor die, which are separate from the die of first drive circuitry 120). These transistors are preferably the conventional enhancement mode transistors, where a voltage more positive than a positive threshold value has to be applied between the gate and source terminals of the NMOS transistor to cause the primary current path of the NMOS transistor conduct, and where a voltage more negative than a negative threshold value has to be applied between the gate and source terminals of the PMOS transistor to cause the primary current path of the PMOS transistor conduct. In addition, since the transistors will be operated in the rarely-used reverse mode during the positive polarity condition, the transistors are preferably the planar type, rather than the vertical type. Transistors 151-152 can supply power under the positive polarity condition to first drive circuitry 120 with less voltage drop across their conduction terminals, such as 0.1 V or less, thereby enabling more voltage to be received by first drive circuitry 120 during the positive polarity condition. Yet, the connection configuration of these components decouples power to first drive circuitry 120 during the negative polarity condition.

NMOS transistor 151 has a first conduction terminal that is electrically coupled to the ground port of first drive circuitry 120, a second conduction terminal that is electrically coupled to negative power terminals 101, and a gate modulation terminal that is electrically coupled to positive power terminal 102. The first conduction terminal of transistor 151 is the intrinsic source terminal (as defined by the anode of the transistor's body diode), and the second conduction terminal of transistor 151 is the intrinsic drain terminal (as defined by the cathode of the transistor's body diode). While an ideal planar NMOS transistor is symmetrical with respect to the source and drain terminals, the substrate in which the NMOS transistor is made is electrically coupled to the source terminal to provide the substrate with a definite voltage since a floating voltage would cause unpredictable behavior. Under the positive polarity condition, the voltage applied to the intrinsic source (IS) of NMOS transistor 151 is more positive than the voltage applied to the intrinsic drain (ID) of transistor 151, thereby causing transistor 151 to operate in the rarely-used reverse mode where the intrinsic source essentially acts as the drain (e.g., the intrinsic source becomes a virtual drain), and where the intrinsic drain acts as the source (e.g., the intrinsic drain becomes a virtual source). Also during the positive polarity condition, the voltage applied to the gate of transistor 151 is more positive than the voltage applied to the intrinsic drain (virtual source) of transistor 151, thereby placing the primary conduction path of the transistor in a conducting state. The voltage across the conduction terminals of the device can be quite low under this condition, such as around 0.1 V. Under the negative polarity condition, the voltage applied to the intrinsic drain (ID) of NMOS transistor 151 is more positive than the voltage applied to the intrinsic source (IS) of transistor 151, thereby causing transistor 151 to operate in the conventionally-used forward mode where the intrinsic source acts as the source, and the intrinsic drain acts as the drain (in this case, there is no virtual source and no virtual drain). The arrangement of the voltages causes the parasitic conduction path of the transistor to be in a non-conductive state. Also during the negative polarity condition, the voltage applied to the gate of NMOS transistor 151 is equal to, or somewhat more negative than, the voltage applied to the intrinsic source of transistor 151, thereby placing the primary conduction path of the transistor in non-conducting states (since the transistor is an enhancement mode transistor). Thus, this connection configuration of NMOS transistor 151, which is reverse to the conventional way of connecting a NMOS transistor between power rails such as power terminals 101 and 102, enables power and voltage to be received by first drive circuitry 120 during the positive polarity condition, and decouples power to first drive circuitry 120 during the negative polarity condition.

PMOS transistor 152 works in a similar, but complementary, way. PMOS transistor 152 has a first conduction terminal that is electrically coupled to the power port of first drive circuitry 120, a second conduction terminal that is electrically coupled to positive power terminals 102, and a gate modulation terminal that is electrically coupled to negative power terminal 101. The first conduction terminal of transistor 152 is the intrinsic source terminal (as defined by the cathode of the transistor's body diode), and the second conduction terminal of transistor 152 is the intrinsic drain terminal (as defined by the anode of the transistor's body diode). While the ideal planar PMOS transistor is symmetrical with respect to the source and drain terminals, the substrate or n-well in which the NMOS transistor is made is electrically coupled to the source terminal to provide the substrate or n-well with a definite voltage. Under the positive polarity condition, the voltage applied to the intrinsic source (IS) of PMOS transistor 152 is more negative than the voltage applied to the intrinsic drain (ID) of transistor 152, thereby causing transistor 152 to operate in the rarely-used reverse mode where the intrinsic source essentially acts as the drain (e.g., the intrinsic source becomes a virtual drain), and where the intrinsic drain acts as the source (e.g., the intrinsic drain becomes a virtual source). Also during the positive polarity condition, the voltage applied to the gate of transistor 152 is more negative than the voltage applied to the intrinsic drain (virtual source) of transistor 152, thereby placing the primary conduction path of the transistor in a conducting state. The voltage across the conduction terminals of the device can be quite low under this condition, such as around 0.1 V. Under the negative polarity condition, the voltage applied to the intrinsic drain (ID) of PMOS transistor 152 is more negative than the voltage applied to the intrinsic source (IS) of transistor 152, thereby causing transistor 152 to operate in the conventionally-used forward mode where the intrinsic source acts as the source, and the intrinsic drain acts as the drain (in this case, there is no virtual source and no virtual drain). The arrangement of the voltages causes the parasitic conduction path of the transistor to be in a non-conductive state. Also during the negative polarity condition, the voltage applied to the gate of PMOS transistor 152 is equal to, or somewhat more positive than, the voltage applied to the intrinsic source of transistor 152, thereby placing the primary conduction path of the transistor in a non-conducting state (since the transistor is an enhancement mode transistor). Thus, this connection configuration of PMOS transistor 152, which is reverse to the conventional way of connecting a PMOS transistor between power rails such as power terminals 101 and 102, enables power and voltage to be received by first drive circuitry 120 during the positive polarity condition, and decouples power to first drive circuitry 120 during the negative polarity condition.

Depending upon the device technology used in the semiconductor dice of circuitry 120 and upon the device technology of the power transistors 106A-C, 108A-C, one of the transistors 151 and 152 may be omitted from the connection modification. For example, transistor 151 can be omitted for the same example provided above for rectifier 141, and transistor 152 can be omitted for the same example provided above for rectifier 142.

It may be appreciated that each of rectifier 142 and PMOS transistor 152 is an example of an auxiliary semiconductor device that is coupled between positive power terminal 102 and the power port of first drive circuitry 120, where the auxiliary semiconductor device is configured to allow current flow to first drive circuitry 120 when the electrical power received at the power terminals has the positive polarity, and to block current flow to first drive circuitry 120 when the electrical power received at the power terminals has the negative polarity. Also, it may be appreciated that each of rectifier 141 and NMOS transistor 151 is an example of an auxiliary semiconductor device that is coupled between negative power terminal 101 and a ground port of first drive circuitry 120, where the auxiliary semiconductor device is configured to allow current flow to first drive circuitry 120 when the electrical power received at the power terminals has the positive polarity, and to block current flow to the first drive circuitry when the electrical power received at the power terminals has the negative polarity.

Figure 3:
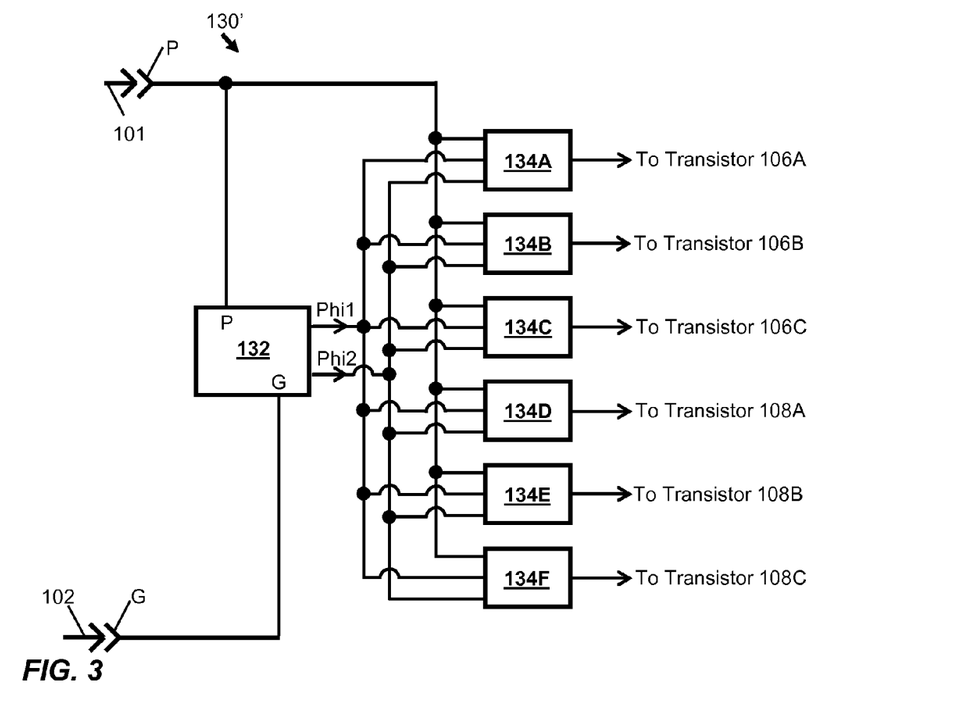
FIG. 3 illustrates an exemplary embodiment of a drive circuitry according to the present invention that is activated under reverse polarity conditions.

FIG. 3 shows an exemplary embodiment 130' of second drive circuitry 130 that may be used when transistors 106A-C and 108A-C comprise n-channel MOSFET transistors. Second drive circuitry 130' comprises a power port P, a ground port G, a clock generator 132 that generates two clock signals Phi1 and Phi2, and a plurality of charge pump circuits 134A-F. Power port P is coupled to negative power terminal 101, and ground port G is coupled to a positive power terminal 102. Second drive circuitry 130' is powered by the voltage and power provided between its power and ground ports. Clock generator 132 has a power port P coupled to the power port P of second drive circuitry 130', a ground port G coupled to the ground port G of second drive circuitry 130', a first output providing clock signal Phi1, and a second output providing clock signal Phi2. Clock signals are preferably alternating and non-overlapping (i.e., when one clock signal is in a logic high state, the other is in a logic low state, and both are in logic low states just prior to either clock signal switching from a logic low state to a logic high state). Clock generator 132 may comprise a ring oscillator circuit that generates a base clock signal, two buffers that output Phi1 and Phi2, respectively, and logic circuitry that generates alternating non-overlapping signals to the inputs of the two buffers. These components and implementations thereof are well-known to the digital circuit art, and one of ordinary skill in the art can construct and use clock generator 132 in view of this disclosure without undue experimentation. Each charge pump circuit 134A-F comprises a first input coupled to power port P of circuit 130', a second input coupled to first clock signals Phi1, a second input coupled to second clock signal Phi2, and an output coupled to the modulation terminal of a respective one of power transistors 106A-C and 108A-C. Each charge pump circuit 134A-F may be constructed according to any one of the charge pump circuits known to the art by one of ordinary skill in the art without undue experimentation in view of this disclosure. Under the negative polarity condition, each charge pump circuit 134A-F generates a potential at its output that is higher in value than the potential at power port P. Under the positive polarity condition, charge pump circuit 134A-F does not generate a signal at its output, and preferably presents a high electrical impedance to the modulation terminal of the power transistor to which is it electrically coupled.

Figure 4A:
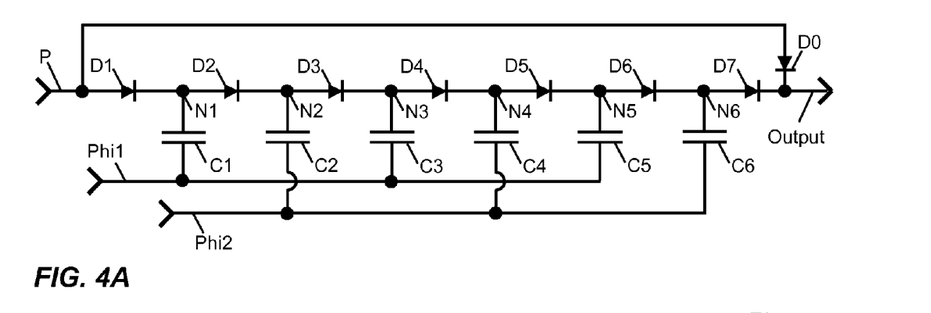
FIG. 4A-4C illustrate exemplary charge pump circuits that may be used in the embodiment illustrated in FIG. 3.

Each charge pump circuit 134A-F may comprise a conventional charge pump circuit shown in FIG. 4A. The conventional charge pump circuit has a series circuit of rectifiers D1-D7 coupled between its first input (which is coupled to power port P) and its output, with a plurality of circuit nodes N1-N6, with each node N1-N6 being disposed between a respective pair of series-coupled rectifiers D1-D7. The conventional charge pump circuit further comprises a first plurality of capacitors C1-C3, each one electrically coupled between the second input (receiving first clock signal Phi1) and a respective one of odd-number nodes N1, N3, and N5, and further comprises a second plurality of capacitors C4-C6, each one electrically coupled between the third input (receiving second clock signal Phi2) and a respective one of even-number nodes N2, N4, and N6. During the reverse polarity condition, the alternating action of clock signals Phi1 and Phi2 moves packets of equivalent positive electrical charge from power port P along the sequence of nodes N1-N6 to the output, causing each successive node to have a higher potential than the previous node in the chain. (In actuality, packets of negatively charged electrons are moved from the output to power port P in the reverse direction along the sequence of nodes N6-N1). For example, when first clock signal Phi1 is logic low and second clock signal Phi2 is logic high, node N1 is charged by rectifier D1 to a value near the potential of port P, and the charge and potential at node N2, which is above the potential at port P, are discharged into node N3 by rectifier D2. Then, when first clock signal Phi1 switches from logic low to logic high and second clock signal Phi2 switches from logic high to logic low, rectifiers D1 and D3 are reverse biased, and rectifier D2 is forward biased, causing and capacitor C1 to change up capacitor C2 and to raise the voltage on node N2. Subsequent stages work in a similar manner. A bootstrap rectifier D1 may be coupled between power port P and the output to initially place the output at a potential near that of power port P. Under the positive polarity condition, clock signals Phi1 and Phi2 stop their switching of logic states and thereby stop prevent equivalent positive charge from being conveyed to the output, thereby ceasing the generation of a control signal. In addition, diodes D0 and D7 become reverse biased, thereby providing a high electrical impedance to the modulation terminal of the power transistor to which it is electrically coupled.

Figure 4B:
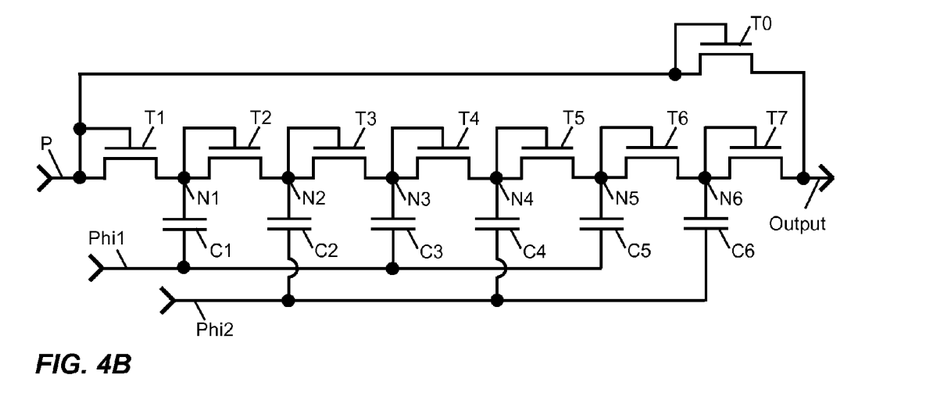
Figure 4C:
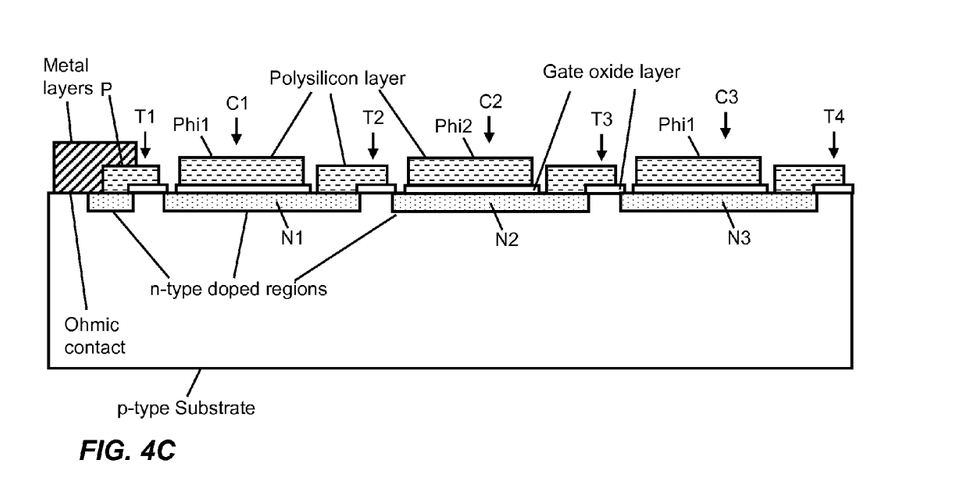

Rectifiers D0-D7 may be implemented by diode-connected NMOS transistors T0-T7, as shown in FIG. 4B. Capacitors C1-C6 may each be implemented by a MOS capacitor formed in substrate. This implementation is partially illustrated in FIG. 4C for just some of the components, where a p-type substrate has a plurality of n-type diffusion regions formed in it, a patterned gate-oxide layer formed over the top surface of the substrate, and a patterned n-type doped polysilicon layer formed over the patterned gate oxide layer and portions of n-type diffusion regions. FIG. 4C shows and identifies the implementation of transistors T1-T4, nodes N1-N3, and capacitors C1-C3; from this, one of ordinary skill in the art can deduce the construction of the other components. The transistors are arranged in sequential order, with a common n-type diffusion region (e.g., N1) serving as the source of one transistor (e.g., T1) and the drain of the next transistor (e.g., T2) of the sequence, and with the common diffusion region providing the connecting node (e.g., N1) and one plate of one of the capacitors (e.g., C1). The gate of the next transistor (e.g., T1) is connected to the common n-type diffusion (e.g., N1) to provide the rectifying function. The other plates of the capacitors are provided by patterned portions of the n-type polysilicon layer, which are separated by corresponding diffusion regions by corresponding patterned portions of the gate-oxide layer. Corresponding metal layer portions may be disposed on top of the patterned portions of the polysilicon layer to reduce the electrical resistance of these layers, particularly in the capacitor areas (not needed in the transistor gate areas). All of the charge pump circuits may be implemented on the same semiconductor die, as long as their nodes N1-N6 and outputs are isolated from one another.

As one implementation option, a metal layer portion may be disposed over the gate and drain of transistor T1, and extended over to the p-type substrate to provide an ohmic contact that ties the substrate to the power port P of the circuit. One or more metal sub-layers may be used to achieve the ohmic contact to the substrate and the electrical contact to the polysilicon layer, as is known in the art. When the positive polarity condition occurs, the p-type substrate will be at ground potential, and the components integrated onto the substrate will be inactive. When the negative polarity condition occurs, the substrate will be at a positive potential, and all of the other conductive elements of the circuit will be at higher potentials. However, this implementation option would preclude the integration of an NMOS based implementation of clock generator 132 on the same die as the NMOS implementation of the charge pump circuits 134A-F, since the clock generator 132 would need the p-type substrate electrically coupled to the ground port G. As another implementation, the p-type substrate shown in FIG. 4C is coupled to the ground port G by a metal ohmic contact that is electrically coupled to both the substrate and port G. This enables an NMOS clock generator 132 and the NMOS charge pump circuits 134A-F to be integrated onto a common p-type substrate. However, when the positive polarity condition occurs, the p-type substrate will be at a positive potential, and the n-type diffusion region for the output of the charge pump circuit will form a forward biased diode with the substrate and generate a current that will interfere with first drive circuitry 120. This can be remedied by using rectifying components similar to rectifiers 141-142 and transistors 151-152 used for some of the implementations of first drive circuitry 120, as described above. This possibility is described below. As another solution, clock generator 132 and charge pump circuits 134A-F may be integrated together on a single die that uses the above described double-nested well CMOS process that is designed to provide reverse bias protection.

Referring back to FIGS. 4A and 4B, with a voltage of 2 volts between power port P and ground port G during the negative polarity condition, and using a forward diode voltage drop of about 0.5 V for rectifiers D0-D7 and diode-connected transistors T0-T7 (transistors with a threshold voltage of about 0.5 V), the charge pump circuit shown in the figures can generate an output voltage in the range of 10 V to 12 V. However, as the charge pump circuits become effective in causing the power transistors 106A-C and 108A-C to conduct, the voltage difference between power terminals 101-102 drops to around one volt or less. As a result, the charge pump circuits are typically only able to reach one-half to three-quarters of their target output value (around 5 to 9 volts for the six-stage charge pump shown in the figures). This is generally sufficient to achieve the desired results described above. Typically, under reverse polarity conditions, a hundred amperes or more can be conducted through the parasitic conduction paths of the power transistors 106A-C and 108A-C during the start of the reverse polarity condition. In this case, the current is not limited by the motor load, but is instead limited by the resistance of the body diodes and the resistance of the external automobile cables that covey power to the power module. The power transistors 106A-C and 108A-C can typically withstand this high amperage for about 300 ms to about 800 ms before sustaining damage. With a typical oscillation frequency for clock generator 132 of 1 MHz to 100 MHz, the exemplary embodiment 130' of second drive circuitry 130 can turn on the primary conduction paths of the power transistors 106A-C and 108A-C within 1 ms to 10 ms, thereby averting damage to the parasitic structures in the power devices that would occur at 300 ms.

As a general rule, it is preferred that second drive circuitry 130 provide control signals to the modulation terminals of power transistors 106A-C and 108A-C that causes the primary current path of each power transistor to conduct an amount of current that is equal to or greater than the current conducted by the transistor's parasitic current path at the start of the reverse polarity condition. This amount of current is hundreds to thousands of times larger than the leakage current of the primary current path (which may be defined as the current conducted with one volt is placed across the conduction terminals of the transistor, with no signal applied to the modulation terminal, such as a zero gate to source voltage). For typical automotive applications, this amount of current is greater than 5 amperes, and more typically greater than 50 amperes.

It is possible to implement clock generator 132 in a technology that can withstand the positive polarity condition without being destroyed and without outputting clock signals to the charge pump circuits 134A-F, and it is possible to use this implementation on separate substrates with the implementation on the charge pump circuits shown in FIG. 4C. Also, as indicated above, it is possible to integrate generator 132 and the charge pump circuits 134A-F together on the same die using the double-nested well CMOS technology. These implementations would provide a second drive circuitry 130' that could be directly connected to power terminals 101 and 102. However, given various product development costs, it can be more cost effective to integrate clock generator 132 and charge pump circuits 134A-F on a single NMOS die or single CMOS die that does not have reverse polarity protection. In this case, connections modifications similar to those shown in FIGS. 2A-2B can be used, as described next.

Figure 5A:
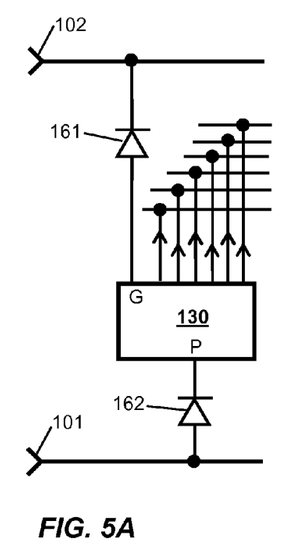
FIGS. 5A and 5B illustrate exemplary connection modifications that may be used when implementing some embodiments of the present invention.

FIG. 5A shows a first connection modification for such an embodiment of second drive circuitry 130 (e.g., 130'). The modification includes coupling a first current rectifier 161 (e.g., diode) in series with the ground feed to second drive circuitry 130, and coupling a second current rectifier 162 (e.g., diode) in series with the power feed to second drive circuitry 130, where the diodes are oriented so that current is only allowed to flow when the electric power source coupled to power terminals 101,102 has the positive polarity. For example, the anode of first current rectifier 161 is coupled to the ground port of second drive circuitry 130, the cathode of first current rectifier 161 is coupled to positive power terminal 102, the anode of second current rectifier 162 is coupled to negative power terminal 101, and the cathode of second current rectifier 162 is coupled to the power port of second drive circuitry 130. Current rectifier 161 and 162 may comprise Schottky diodes that have relatively low voltage drops (around 0.3 V) under forward bias, which typically have moderate impact on the drive capability of second drive circuitry 130. To reduce this impact, one of the rectifiers can be removed for some implementations, as described below. Current rectifiers 161 and 162 are preferably formed on semiconductor dice that are physically separate from the one or more semiconductor dice that may be used to implement second drive circuitry 130 (e.g., the rectifiers are discrete components). This separation prevents parasitic current paths from being formed between the components that might defeat the intended purpose of rectifiers 161 and 162. Typically, during the positive polarity condition, the circuit nodes in the implementation of second drive circuitry 130 will move toward the voltage being applied by the control signals generated by second drive circuitry 130. This is because the outputs of both drive circuitries 120, 130 are coupled together by their common couplings to the modulation terminals of the power transistors 106, 108, and because the outputs of circuitry 120' are coupled to doped regions of the semiconductor substrates (e.g., drain regions of some of the transistors formed).

Depending upon the device technology used in the semiconductor dice of circuitry 130, and depending upon the device technology of the power transistors 106A-C, 108A-C, one of the current rectifiers 161 and 162 may be omitted from the connection modification. For example, when power transistors 106A-C, 108A-C comprise n-channel MOSFETs and circuitry 130 is implemented with simple NMOS technology built on a p-type substrate or simple n-well CMOS technology built on a p-type substrate, then second current rectifier 162 can be omitted. The reason for this is as follows. During the positive polarity condition, when we want second drive circuitry 130 to be inactive, we want to keep the p-type substrate from forming forward biased diodes with the n-type diffusion regions of the charge pump circuits 134 that provide the outputs of the circuits. Therefore, first rectifier 161 cannot be omitted since it is coupled to the p-type substrate, but second rectifier 162 can be omitted. First rectifier 161 prevents power from feeding clock generator 132. The p-type substrate is then allowed to float downward in potential by the leakage currents of the reversed biased p-n junctions in the substrate that are coupled to the power port P of circuit 130. This ensures that the p-type substrate forms reverse biased p-n diodes with diffusion regions from which the outputs of charge pumps are provided. As another example, first current rectifier 161 can be omitted (with second current rectifier 162 retained) when power transistors 106A-C, 108A-C comprise p-channel MOSFETs and circuitry 130 is implemented with the above-described simple p-well CMOS technology built on an n-type substrate, and with the charge pump circuitry being implemented with PMOS transistors. In this case, under the positive polarity condition, the n-type substrate is coupled to ground potential, and the p-n junctions formed between the n-type substrate and the p-type diffusion regions of the charge pump outputs are reverse biased.

Figure 5B:
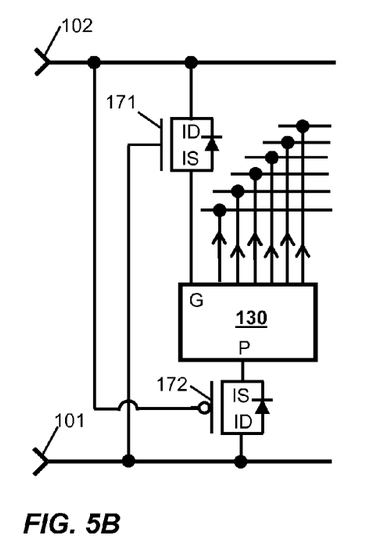

Instead of using first and second rectifying devices 161 and 162, a discrete NMOS transistor 171 and a discrete PMOS transistor 172 may be used, as illustrated in FIG. 5B (these discrete transistors are disposed on individual semiconductor dice, which are separate from the die of second drive circuitry 130). These transistors are preferably the conventional enhancement mode transistors, described above. In addition, since the transistors will be operated in the rarely-used reverse mode during the negative polarity condition, the transistors are preferably the planar type, rather than the vertical type. Transistors 171-172 can supply power under the negative polarity condition to second drive circuitry 130 with less voltage drop across their conduction terminals, such as 0.1 V or less, thereby enabling more voltage to be received by second drive circuitry 130 during the negative polarity condition. Yet, the connection configuration of these components decouples power to second drive circuitry 130 during the positive polarity condition.

NMOS transistor 171 has a first conduction terminal that is electrically coupled to the ground port of second drive circuitry 130, a second conduction terminal that is electrically coupled to positive power terminals 102, and a gate modulation terminal that is electrically coupled to negative power terminal 101. The first conduction terminal of transistor 171 is the intrinsic source terminal (as defined by the anode of the transistor's body diode), and the second conduction terminal of transistor 171 is the intrinsic drain terminal (as defined by the cathode of the transistor's body diode). While an ideal planar NMOS transistor is symmetrical with respect to the source and drain terminals, the substrate in which the NMOS transistor is made is electrically coupled to the source terminal to provide the substrate with a definite voltage since a floating voltage would cause unpredictable behavior. Under the negative polarity condition, the voltage applied to the intrinsic source (IS) of NMOS transistor 171 is more positive than the voltage applied to the intrinsic drain (ID) of transistor 171, thereby causing transistor 171 to operate in the rarely-used reverse mode where the intrinsic source essentially acts as the drain (e.g., the intrinsic source becomes a virtual drain), and where the intrinsic drain acts as the source (e.g., the intrinsic drain becomes a virtual source). Also during the negative polarity condition, the voltage applied to the gate of transistor 171 is more positive than the voltage applied to the intrinsic drain (virtual source) of transistor 171, thereby placing the primary conduction path of the transistor in a conducting state. The voltage across the conduction terminals of the device can be quite low under this condition, such as around 0.1 V. Under the positive polarity condition, the voltage applied to the intrinsic drain (ID) of NMOS transistor 171 is more positive than the voltage applied to the intrinsic source (IS) of transistor 171, thereby causing transistor 171 to operate in the conventionally-used forward mode where the intrinsic source acts as the source, and the intrinsic drain acts as the drain (in this case, there are no virtual source and no virtual drain). The arrangement of the voltages causes the parasitic conduction path of the transistor to be in a non-conductive state. Also during the positive polarity condition, the voltage applied to the gate of NMOS transistor 171 is equal to, or somewhat more negative than, the voltage applied to the intrinsic source of transistor 171, thereby placing the primary conduction path of the transistor in non-conducting states (since the transistor is an enhancement mode transistor). Thus, this connection configuration of NMOS transistor 171, which is reverse to the conventional way of connecting a NMOS transistor between power rails such as power terminals 101 and 102, enables power and voltage to be received by second drive circuitry 130 during the negative polarity condition, and decouples power to second drive circuitry 130 during the positive polarity condition.

PMOS transistor 172 works in a similar, but complementary, way. PMOS transistor 172 has a first conduction terminal that is electrically coupled to the power port P of second drive circuitry 130, a second conduction terminal that is electrically coupled to negative power terminals 101, and a gate modulation terminal that is electrically coupled to positive power terminal 102. The first conduction terminal of transistor 172 is the intrinsic source terminal (as defined by the cathode of the transistor's body diode), and the second conduction terminal of transistor 172 is the intrinsic drain terminal (as defined by the anode of the transistor's body diode). While the ideal planar PMOS transistor is symmetrical with respect to the source and drain terminals, the substrate or n-well in which the NMOS transistor is made is electrically coupled to the source terminal to provide the substrate or n-well with a definite voltage. Under the negative polarity condition, the voltage applied to the intrinsic source (IS) of PMOS transistor 172 is more negative than the voltage applied to the intrinsic drain (ID) of transistor 172, thereby causing transistor 172 to operate in the rarely-used reverse mode where the intrinsic source essentially acts as the drain (e.g., the intrinsic source becomes a virtual drain), and where the intrinsic drain acts as the source (e.g., the intrinsic drain becomes a virtual source). Also during the negative polarity condition, the voltage applied to the gate of transistor 172 is more negative than the voltage applied to the intrinsic drain (virtual source) of transistor 172, thereby placing the primary conduction path of the transistor in a conducting state. The voltage across the conduction terminals of the device can be quite low under this condition, such as around 0.1 V. Under the positive polarity condition, the voltage applied to the intrinsic drain (ID) of PMOS transistor 172 is more negative than the voltage applied to the intrinsic source (IS) of transistor 172, thereby causing transistor 172 to operate in the conventionally-used forward mode where the intrinsic source acts as the source, and the intrinsic drain acts as the drain (in this case, there is no virtual source and no virtual drain). The arrangement of the voltages causes the parasitic conduction path of the transistor to be in a non-conductive state. Also during the positive polarity condition, the voltage applied to the gate of PMOS transistor 172 is equal to, or somewhat more positive than, the voltage applied to the intrinsic source of transistor 172, thereby placing the primary conduction path of the transistor in a non-conducting state (since the transistor is an enhancement mode transistor). Thus, this connection configuration of PMOS transistor 172, which is reverse to the conventional way of connecting a PMOS transistor between power rails such as power terminals 101 and 102, enables power and voltage to be received by second drive circuitry 130 during the negative polarity condition, and decouples power to second drive circuitry 130 during the positive polarity condition.

Because transistors 171 and 172 are intended to have their primary conduction path be conductive during the negative polarity condition where the voltage between power terminals 101-102 will be around 2 V or less, it is preferred that the transistors have threshold voltages that have relatively low magnitudes, such as around half a volt to a quarter of a volt.

Depending upon the device technology used in the semiconductor dice of circuitry 130 and depending upon the device technology of the power transistors 106A-C, 108A-C, one of the transistors 171 and 172 may be omitted from the connection modification. For example, transistor 171 can be omitted for the same example provided above for rectifier 161, and transistor 172 can be omitted for the same example provided above for rectifier 162.

It may be appreciated that each of rectifier 161 and NMOS transistor 171 is an example of an auxiliary semiconductor device that is coupled between positive power terminal 102 and the ground port of second drive circuitry 130, where the auxiliary semiconductor device is configured to allow current flow to second drive circuitry 130 when the electrical power received at the power terminals has the negative polarity, and to block current flow to second drive circuitry 130 when the electrical power received at the power terminals has the positive polarity. Also, it may be appreciated that each of rectifier 162 and PMOS transistor 172 is an example of an auxiliary semiconductor device that is coupled between negative power terminal 101 and a power port of second drive circuitry 130, where the auxiliary semiconductor device is configured to allow current flow to second drive circuitry 130 when the electrical power received at the power terminals has the negative polarity, and to block current flow to the second drive circuitry when the electrical power received at the power terminals has the positive polarity.

Figure 6:
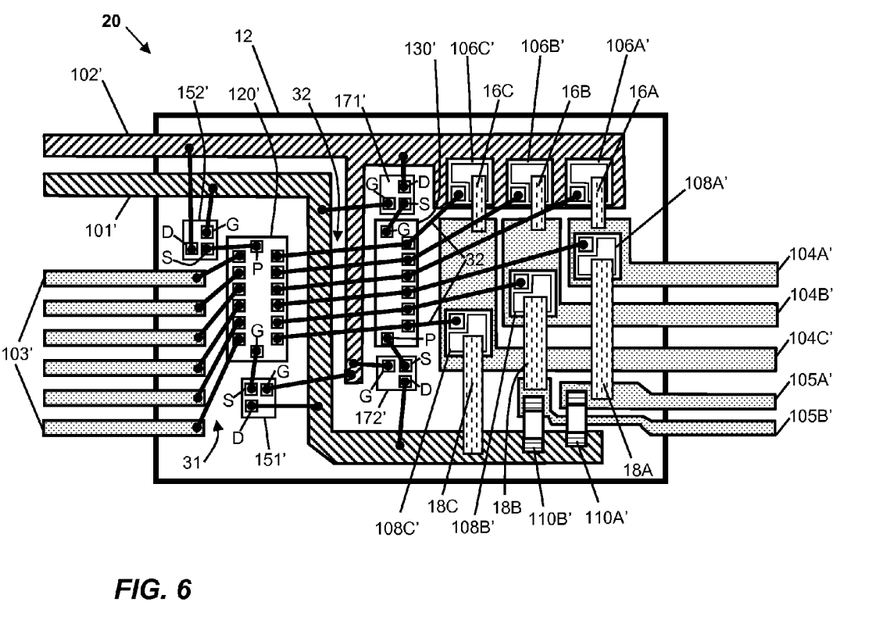
FIG. 6 shows a top plan view of an exemplary power module according to the present invention.
Figure 7:
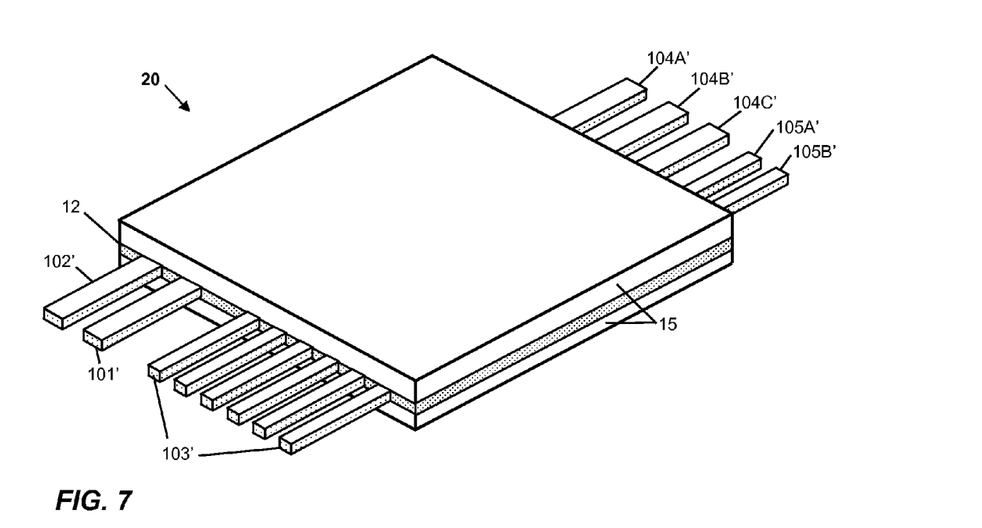
FIG. 7 shows a perspective view of an exemplary power module according to the present invention.

It may be appreciated that some silicon-on-insulator technologies, and some double nested well CMOS technologies would allow drive circuits 120 and 130 to be integrated onto the same semiconductor die, and without the need for rectifiers 141-142, 161-162, or for transistors 151-152, 171-172.

for the purposes of illustration, and without loss of generality, FIG. 6 shows a top plan view of an exemplary power module 20 which implements an exemplary embodiment of power handling circuit 100, along with the transistors 151-152 shown in FIG. 2B and the transistors 171-172 shown in FIG. 5B. A molded lead-frame substrate 12 may be used as a substrate to hold the components and connections of the embodiment. Substrate 12 comprises a lead frame with leads 101' and 102' to implement power terminals 101 and 102, respectively, a plurality of leads 103' to implement input terminals 103, a plurality of leads 104A'-104C' to implement output terminals 104A-104C, respectfully, and a plurality of 105'-105B' to implement output terminals 105A-105B, respectively. Molding material can be used depending on the module technology (e.g., insert molding, transfer molding, etc.). Power transistors 106A-106C can be implemented by vertical power transistors integrated on individual die 106A'-106C', each such die have a large source connection pad and a small gate connection pad on the die's top surface (as shown in the figure), and a large drain connection pad on the die's bottom surface. Dice 106A'-106C' can be mounted on a large area of power terminal lead 102' that serves as a die attach area, with the drain connection pad of these dice soldered to power terminal lead 102'. In a similar manner, power transistors 108A-108C can be implemented by vertical transistors integrated on individual die 108A'-108C', each such die have a large source connection pad and a small gate connection pad on the die's top surface (as shown in the figure), and a large drain connection pad on the die's bottom surface. Each of dice 108A'-108C' can be mounted on a large area of a respective one of output terminal leads 104'-104C', the large area serving as a die attach area, with the drain connection pad of each die being soldered to its respective output terminal. A first surface mount resistor 110A' can implement shunt resistor 110A; it has a first terminal soldered to a portion of ground power terminal lead 101', and a second terminal solder to a portion of sensor terminal lead 105A'. Similarly, a second surface mount resistor 110B' can implement shunt resistor 110B; it has a first terminal soldered to a portion of ground power terminal lead 101', and a second terminal solder to a portion of sensor terminal lead 105B'.

To complete the power circuit paths, a set 16A of multiple wire-bonds or one or more clips electrically connects the source pad of die 106A' to output terminal lead 104A', a set 16B of multiple wire-bonds or one or more clips electrically connects the source pad of die 106B' to output terminal lead 104B', a set 16C of multiple wire-bonds or one or more clips electrically connects the source pad of die 106C' to output terminal lead 104C', a set 18A of multiple wire-bonds or one or more clips electrically connects the source pad of die 108A' to a portion of sensor terminal lead 105A', a set 18B of multiple wire-bonds or one or more clips electrically connects the source pad of die 108B' to a portion of sensor terminal lead 105B', and a set 18C of multiple wire-bonds or one or more clips electrically connects the source pad of die 108C' to a portion of ground power terminal lead 101'. The wire-bonds or clips of sets 18A-18C have sufficient height in their middle sections so that they do not electrically contact output terminal leads 104A'-104C'.

First drive circuitry 120 may be implemented by a die 120' that is mounted to a molding portion of substrate 12 with an adhesive, such as epoxy. Similarly, second drive circuitry 130 may be implemented by a die 130' that is mounted to a molding portion of substrate 12 with an adhesive, such as epoxy. Likewise, transistors 151-152 and 171-172 may be implemented by respective planar transistors implemented on separate dice 151'-152', and 171'-172', respectively, and mounted to molding portion of substrate 12 with respective bodies of adhesive, such as epoxy. The sizes of these dice are exaggerated with respect to the dice for the power transistors in order to better show the wire-bond connections (described next). A plurality of single-segment wire-bonds 31 individually connect the plurality of input terminal leads 103' to respective input pads of first driver die 120', as shown in the figure. A plurality of double-segment wire-bonds 32 (e.g., stitch bonds) individually connect the plurality of output pads of first driver die 120' to respective of output pads of second driver die 130', and then onto respective gad pads of power transistor dice 106A'-106C' and 108A'-108C', as shown in the figure. Wire-bonds 32 have sufficient height that they do not contact wire-bonds/clips of sets 16B and 16C. Transistor dice 151'-152' are interconnected with wire-bonds as follows: a wire-bond connects the gate (G) of transistor die 151' to positive power lead 102', a wire-bond connects the source (S) of transistor die 151' to a ground port pad (G) of first driver die 120', a wire-bond connects the drain (D) of transistor die 151' to negative power lead 101', a wire-bond connects the gate (G) of transistor die 152' to negative power lead 101', a wire-bond connects the source (S) of transistor die 152' to a power port pad (P) of first driver die 120', and a wire-bond connects the drain (D) of transistor die 152' to positive power lead 102'. Transistor dice 171'-172' are interconnected with wire-bonds as follows: a wire-bond connects the gate (G) of transistor die 171' to negative power lead 101', a wire-bond connects the source (S) of transistor die 171' to a ground port pad (G) of second driver die 130', a wire-bond connects the drain (D) of transistor die 171' to positive power lead 102', a wire-bond connects the gate (G) of transistor die 172' to positive power lead 102', a wire-bond connects the source (S) of transistor die 172' to a power port pad (P) of second driver die 130', a wire-bond connects the drain (D) of transistor die 172' to negative power lead 101'.

After assembling the above components on substrate 12, an over molding material 15 can enclose the module.

The power handling circuits and power modules described above can be used in electrical assemblies including circuit boards with the packages mounted thereon. They may also be used in systems such as power controllers, computers, communication equipment, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A power handling circuit comprising:
   a positive power terminal and a negative power terminal that receive an electrical power source, the electrical power received at the power terminals having a positive polarity when the positive power terminal has a higher electrical potential than the negative power terminal, and having a negative polarity when the negative power terminal has a higher electrical potential than the positive power terminal;
   a first semiconductor device having a first conduction terminal, a second conduction terminal, a modulation terminal, and a primary current path between its first and second conduction terminals, the first semiconductor device conducting current through its primary current path responsive to an electrical signal applied to its modulation terminal;
   a first drive circuitry coupled to the modulation terminal of the first semiconductor device, the first drive circuitry generating an electrical signal that is coupled to the modulation terminal when the electrical power received at the power terminals has the positive polarity, wherein a power port of the first drive circuitry is coupled to the positive power terminal and a ground port of the first drive circuitry is coupled to the negative power terminal; and
   a second drive circuitry coupled to the modulation terminal of the first semiconductor device, the second drive circuitry circuit generating an electrical signal to the modulation terminal of the first semiconductor device that causes the primary current path of the first semiconductor device to become conductive when the electrical power received at the power terminals has the negative polarity, wherein a power port of the second drive circuitry is coupled to the negative power terminal and a ground port of the second drive circuitry is coupled to the positive power terminal.

2. The power handling circuit of claim 1, further comprising a first circuit path from the positive power terminal to the negative power terminal, the first circuit path including the first semiconductor device, and wherein first and second conduction terminals of the first semiconductor device are coupled to the first circuit path.

3. The power handling circuit of claim 1, wherein the first semiconductor device further has a parasitic current path between its first and second conduction terminals, the first semiconductor device conducting current through its parasitic current path when the electrical power received at the power terminals has a negative polarity.

4. The power handing circuit of claim 1, further comprising a first control input that receives a first control signal, and wherein the first drive circuitry is coupled to the first control input, and when the electrical power received at the power terminals has the positive polarity, the first drive circuitry generates its electrical signal to the modulation terminal of the first semiconductor device in a manner that is responsive to an electrical signal present on the first control input.

5. The power handing circuit of claim 1, wherein the second drive circuitry circuit ceases generating an electrical signal to the modulation terminal of the first semiconductor device that causes the primary current path of the first semiconductor device to become conductive when the electrical power received at the power terminals has the positive polarity.

6. The power handing circuit of claim 1, wherein in the second drive circuitry comprises a clock generator and a charge pump circuit.

7. The power handing circuit of claim 1, further comprising a first auxiliary semiconductor device coupled between the positive power terminal and the ground port of the second drive circuitry, the first auxiliary semiconductor device being configured to allow current flow to the second drive circuitry when the electrical power received at the power terminals has the negative polarity, and to block current flow to the second drive circuitry when the electrical power received at the power terminals has the positive polarity.

8. The power handing circuit of claim 7, wherein the first auxiliary semiconductor device comprises a rectifier.

9. The power handing circuit of claim 7, wherein the first auxiliary semiconductor device comprises an NMOS transistor.

10. The power handing circuit of claim 7, wherein the second drive circuitry is disposed on a first semiconductor die, and wherein the first auxiliary semiconductor device is disposed on a second semiconductor die that is separate from the first semiconductor die.

11. The power handing circuit of claim 7, further comprising a second auxiliary semiconductor device coupled between the negative power terminal and the power port of the second drive circuitry, the second auxiliary semiconductor device being configured to allow current flow to the second drive circuitry when the electrical power received at the power terminals has the negative polarity, and to block current flow to the second drive circuitry when the electrical power received at the power terminals has the positive polarity.

12. The power handing circuit of claim 11, wherein the second auxiliary semiconductor device comprises a rectifier.

13. The power handing circuit of claim 11, wherein the second auxiliary semiconductor device comprises a PMOS transistor.

14. The power handing circuit of claim 11, wherein the second drive circuitry is disposed on a first semiconductor die, and wherein the second auxiliary semiconductor device is disposed on a second semiconductor die that is separate from the first semiconductor die.

15. The power handing circuit of claim 1, wherein the first drive circuitry circuit ceases generating an electrical signal to the modulation terminal of the first semiconductor device when the electrical power received at the power terminals has the negative polarity.

16. The power handing circuit of claim 1, further comprising a first auxiliary semiconductor device coupled between the positive power terminal and the power port of the first drive circuitry, the first auxiliary semiconductor device being configured to allow current flow to the first drive circuitry when the electrical power received at the power terminals has the positive polarity, and to block current flow to the first drive circuitry when the electrical power received at the power terminals has the negative polarity.

17. The power handing circuit of claim 16, further comprising a second auxiliary semiconductor device coupled between the negative power terminal and the ground port of the first drive circuitry, the second auxiliary semiconductor device being configured to allow current flow to the first drive circuitry when the electrical power received at the power terminals has the positive polarity, and to block current flow to the first drive circuitry when the electrical power received at the power terminals has the negative polarity.

18. A power module comprising:
a substrate; and
the power handling circuit of claim 1 disposed on the substrate.

19. The power handling circuit of claim 1, further comprising a first auxiliary semiconductor device coupling the power port of the second drive circuitry to the negative power terminal and configured to allow current to flow to the power port of the second drive circuitry only when the electrical power received at the power terminals has the negative polarity.

20. The power handling circuit of claim 19, further comprising a second auxiliary semiconductor device coupling the power port of the first drive circuitry to the positive power terminal and configured to allow current to flow to the power port of the first drive circuitry only when the electrical power received at the power terminals has the positive polarity.

21. The power handling circuit of claim 20, wherein:
the first auxiliary semiconductor device comprises a rectifier oriented to allow current to flow between the negative power terminal and the power input of the second drive circuitry only in a direction from the negative power terminal to the power input of the second drive circuitry; and
the second auxiliary semiconductor device comprises a rectifier oriented to allow current to flow between the positive power terminal and the power input of the first drive circuitry only in a direction from the positive power terminal to the power input of the first drive circuitry.

22. The power handling circuit of claim 20, wherein:
the first auxiliary semiconductor device comprises a transistor configured to conduct current between the negative power terminal and the power input of the second drive circuitry only when the electrical power received at the power terminals has the negative polarity; and
the second auxiliary semiconductor device comprises a transistor configured to conduct current between the positive power terminal and the power input of the first drive circuitry only when the electrical power received at the power terminals has the positive polarity.

23. A power handling circuit comprising:
a positive power terminal and a negative power terminal that receive an electrical power source, the electrical power received at the power terminals having a positive polarity when the positive power terminal has a higher electrical potential than the negative power terminal, and having a negative polarity when the negative power terminal has a higher electrical potential than the positive power terminal;
a first circuit path from the positive power terminal to the negative power terminal, the first circuit path including a first semiconductor device;
the first semiconductor device having a first conduction terminal coupled to the first circuit path, a second conduction terminal coupled to the first circuit path, a modulation terminal, a primary current path between its first and second conduction terminals, and a parasitic current path between its first and second conduction terminals, the first semiconductor device conducting current through its primary current path responsive to an electrical signal applied to its modulation terminal, the first semiconductor device conducting current through its parasitic current path when the electrical power received at the power terminals has a negative polarity;
a first control input that receives a first control signal;
a first drive circuitry coupled to the first control input and the modulation terminal of the first semiconductor device, the first drive circuitry generating an electrical signal that is coupled to the modulation terminal and that is responsive to an electrical signal present on the first control input when the electrical power received at the power terminals has the positive polarity, wherein a power port of the first drive circuitry is coupled to the positive power terminal and a ground port of the first drive circuitry is coupled to the negative power terminal;
a second drive circuitry coupled to the modulation terminal of the first semiconductor device, the second drive circuitry coupling an electrical signal to the modulation terminal of the first semiconductor device that causes the primary current path of the first semiconductor device to become conductive when the electrical power received at the power terminals has the negative polarity, wherein a power port of the second drive circuitry is coupled to the negative power terminal and a ground port of the second drive circuitry is coupled to the positive power terminal.

24. A method of operating a semiconductor device in a power handling circuit, the power handling circuit having a positive power terminal and a negative power terminal to receive an electrical power source, an input terminal to receive an input signal, and a first semiconductor device having a first conduction terminal, a second conduction terminal, a modulation terminal, and a primary current path between its first and second conduction terminals, the electrical power received at the power terminals having a positive polarity when the positive power terminal has a higher electrical potential than the negative power terminal, and having a negative polarity when the negative power terminal has a higher electrical potential than the positive power terminal, the method comprising:
when the electrical power received at the power terminals has the positive polarity:
providing current flow from the power terminals to power ports of a first drive circuitry,
blocking current flow from the power terminals to power ports of a second drive circuitry, and
providing a control signal from the first drive circuitry to the modulation terminal of a first semiconductor device that is responsive to the received input signal; and
when the electrical power received at the power terminals has the negative polarity:
providing current flow from the power terminals to the power ports of the second drive circuitry,
blocking current flow from the power terminals to the power ports of the first drive circuitry, and
providing a signal from the second drive circuitry to the modulation terminal of a first semiconductor device that causes a current to flow through the primary current path of the first semiconductor device.

* * * * *